(12) United States Patent
Yoshimura et al.

(10) Patent No.: US 9,341,340 B2
(45) Date of Patent: May 17, 2016

(54) LIGHT SOURCE UNIT

(71) Applicants: Kenichi Yoshimura, Kanagawa (JP);
Mitsuru Nakajima, Kanagawa (JP);
Shuichi Suzuki, Kanagawa (JP);
Yuusuke Hayashi, Kanagawa (JP)

(72) Inventors: Kenichi Yoshimura, Kanagawa (JP);
Mitsuru Nakajima, Kanagawa (JP);
Shuichi Suzuki, Kanagawa (JP);
Yuusuke Hayashi, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 13/920,401

(22) Filed: Jun. 18, 2013

(65) Prior Publication Data

US 2014/0003062 A1 Jan. 2, 2014

(30) Foreign Application Priority Data

Jun. 27, 2012 (JP) ................. 2012-143864

(51) Int. Cl.
*F21V 5/00* (2015.01)
*H04N 1/028* (2006.01)
*H04N 1/024* (2006.01)

(52) U.S. Cl.
CPC ................ *F21V 5/00* (2013.01); *H04N 1/0249* (2013.01); *H04N 1/0282* (2013.01); *H04N 1/02895* (2013.01)

(58) Field of Classification Search
CPC ........ F21V 5/00; G02B 19/0061; G02B 7/02; H04N 1/00

USPC ..................................................... 362/311.12
See application file for complete search history.

(56) References Cited

U.S. PATENT DOCUMENTS

| 2002/0075916 | A1* | 6/2002 | Sato et al. ........................ 372/36 |
| 2007/0230182 | A1 | 10/2007 | Tai et al. |
| 2008/0085077 | A1* | 4/2008 | Miyanari et al. ................ 385/35 |
| 2008/0138019 | A1 | 6/2008 | Okamura et al. |
| 2013/0077083 | A1 | 3/2013 | Suzuki et al. |
| 2013/0120734 | A1 | 5/2013 | Ogata et al. |

FOREIGN PATENT DOCUMENTS

| EP | 0 318 970 A1 | 6/1989 |
| EP | 0 555 872 A2 | 8/1993 |
| EP | 1 921 476 A1 | 5/2008 |

(Continued)

OTHER PUBLICATIONS

English machine translation of JP 05-022530.*

(Continued)

*Primary Examiner* — Anne Hines
(74) *Attorney, Agent, or Firm* — Oblon, McClelland, Maier & Neustadt, L.L.P.

(57) ABSTRACT

A light source unit includes a light source, a light source support to hold the light source, a fixing member which is attached to the light source support and includes a through-hole through which beams of light emitted from the light source pass, a lens holder inserted into the through-hole and attached to the fixing member by an adhesive; and a collimating lens to collimate the beams of light from the light source, wherein attachment surfaces of the adhesive for the lens holder has a tilted attachment surface tilted relative to the optical axis of the collimating lens.

11 Claims, 11 Drawing Sheets

(56) References Cited

FOREIGN PATENT DOCUMENTS

| | | |
|---|---|---|
| JP | H01-238612 | 9/1989 |
| JP | 5-022530 | 1/1993 |
| JP | 5-088061 | 4/1993 |
| JP | 7-086681 | 3/1995 |
| JP | 9-246658 A | 9/1997 |
| JP | 11-352432 | 12/1999 |
| JP | 2001-071553 | 3/2001 |
| JP | 2001-228419 | 8/2001 |
| JP | 2002-244062 | 8/2002 |
| JP | 2008-116553 A | 5/2008 |

OTHER PUBLICATIONS

English machine translation of JP 11-352432.*
English machine translation of JP 2008-116553.*
Extended European Search Report issued Oct. 4, 2013, in European Patent Application No. 13173605.0.
European Search Report issued in Application No. 13 173 605.0 on Jul. 2, 2015.
Office Action issued in European Patent Application No. 13173605.0 on Feb. 24, 2016.

* cited by examiner

LIGHT SOURCE UNIT

CROSS-REFERENCE TO RELATED APPLICATIONS

This patent application is based on and claims priority pursuant to 35 U.S.C. §119 to Japanese Patent Application No. 2012-143864, filed on Jun. 27, 2012, in the Japan Patent Office, the entire disclosure of which is hereby incorporated by reference herein.

BACKGROUND

1. Technical Field

The present invention relates to a light source unit, and more particularly, to a light source unit having a collimating lens.

2. Background Art

JP-3070996-B1 (JP-H05-088061-A) and JP-4132598-B1 (JP-2001-228419-A), for example, disclose a light source unit for use in an image forming apparatus or the like that has a semiconductor laser and a collimating lens arranged on a light path of beams of light emitted from the semiconductor laser.

In such a configuration, the directionality (optical axiality) of the emitted beams of light and parallelism (collimation) are important.

For this reason, at least one of the semiconductor laser and the collimating lens are adjusted about three axes mutually perpendicular to each other to obtain a desirable position relative to the luminous point of the semiconductor laser and the collimating lens. This precision positioning requires accuracy to within 1 micrometer or less.

However, conventionally, the effect of an external impact on the light source unit has not been considered in the design thereof.

In particular, an impact applied from a direction parallel to the optical axis of the collimating lens possibly displaces the relative positions of the luminous point of the semiconductor laser and the collimating lens.

SUMMARY

The present invention provides a light source unit that includes a light source; a light source support to hold the light source; a fixing member which is attached to the light source support and includes a through-hole through which beams of light emitted from the light source pass; a cylindrical lens holder inserted into the through-hole, which is attached to the fixing member by an adhesive; and a collimating lens to collimate the beams of light from the light source. Attachment surfaces of the adhesive for the lens holder have a tilted attachment surface tilted relative to the optical axis of the collimating lens.

BRIEF DESCRIPTION OF THE DRAWINGS

Various other objects, features and attendant advantages of the present invention will be more fully appreciated as the same become better understood from the detailed description when considered in connection with the accompanying drawings, in which like reference characters designate like corresponding parts throughout and wherein.

DETAILED DESCRIPTION

Figure 1:
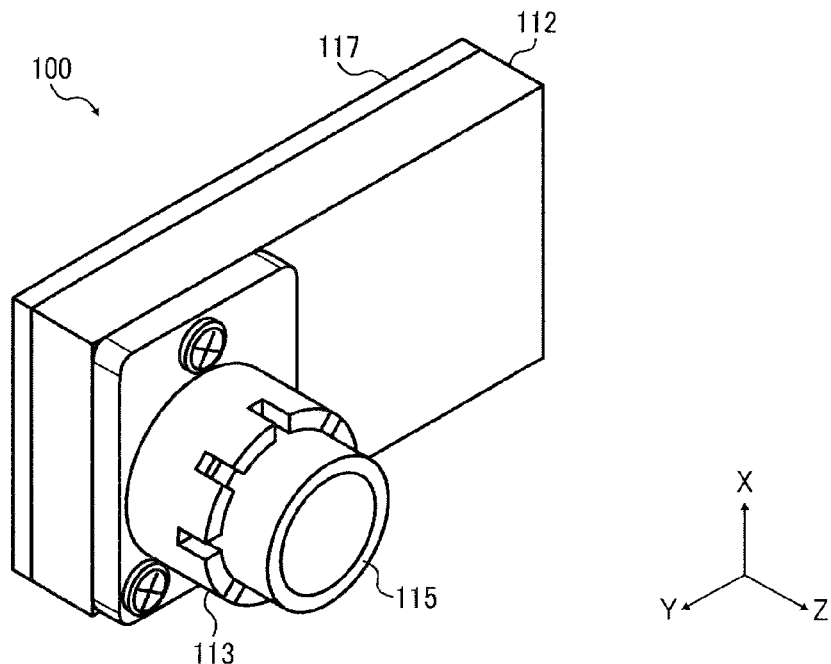
FIG. 1 is a perspective view illustrating a light source unit of an embodiment according to the present disclosure.

One embodiment of the present disclosure is described with reference to FIGS. 1 to 15. FIG. 1 is a perspective view illustrating a light source unit 100 of the embodiment.

The present disclosure is described using the X-Y-Z three-dimensional coordinate system with the Z axis having a direction parallel to the traveling direction of light emitted from the light source unit 100.

Figure 2:
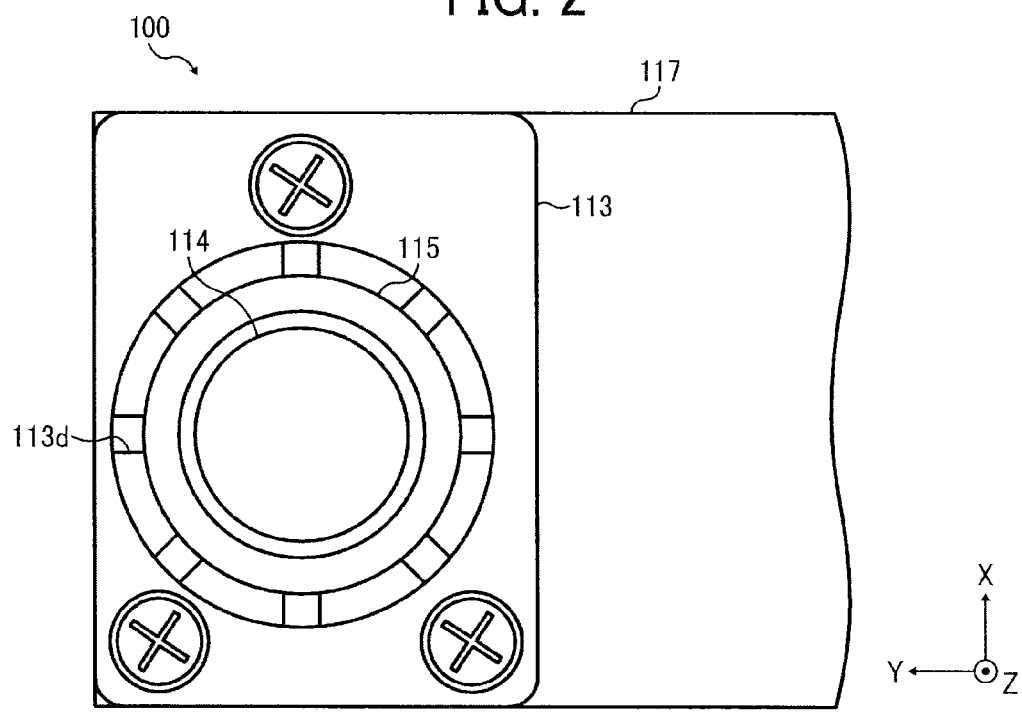
FIG. 2 is a front view illustrating the light source unit of FIG. 1.
Figure 3:
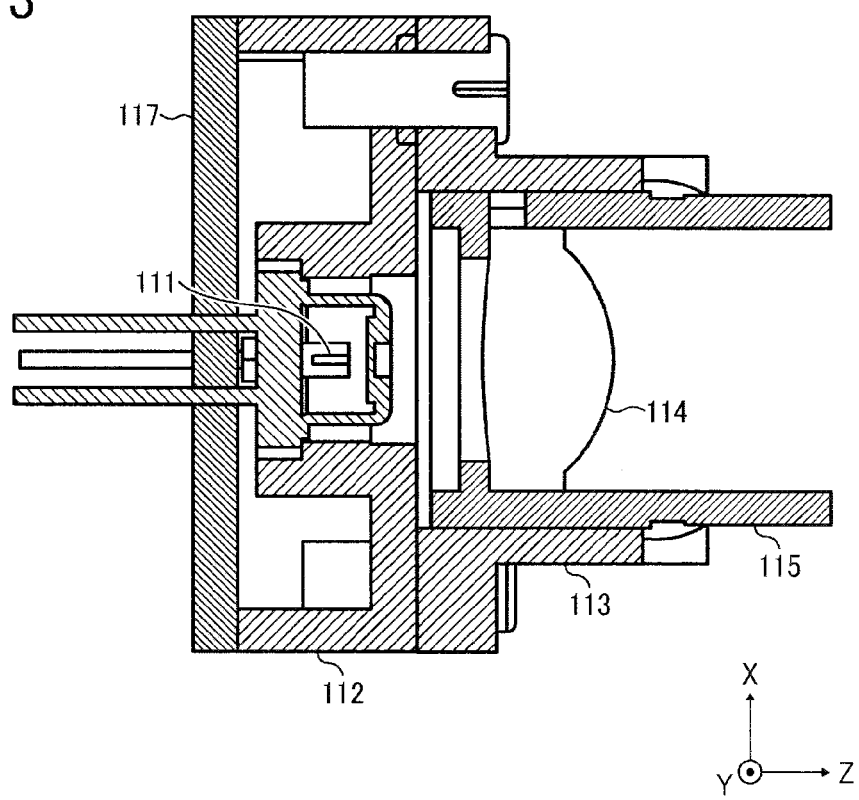
FIG. 3 is a cross-sectional view of the light source unit of FIG. 1 about X-Z direction.

FIG. 2 is a front view of the light source unit 100 and FIG. 3 is a X-Z cross sectional view of the light source unit 100.

As illustrated in FIGS. 1 to 3, the light source unit 100 has a light source (semiconductor laser) 111, a light source support 112, a fixing member 113, a collimating lens 114, a lens holder 115, and optionally a printed substrate 117. The latitudinal direction of the printed substrate 117 is X axis direction and, the longitudinal direction, Y axis direction.

In the present embodiment, the semiconductor laser 111 is a laser diode. However, the semiconductor laser 111 is not limited to a laser diode.

Figure 4:
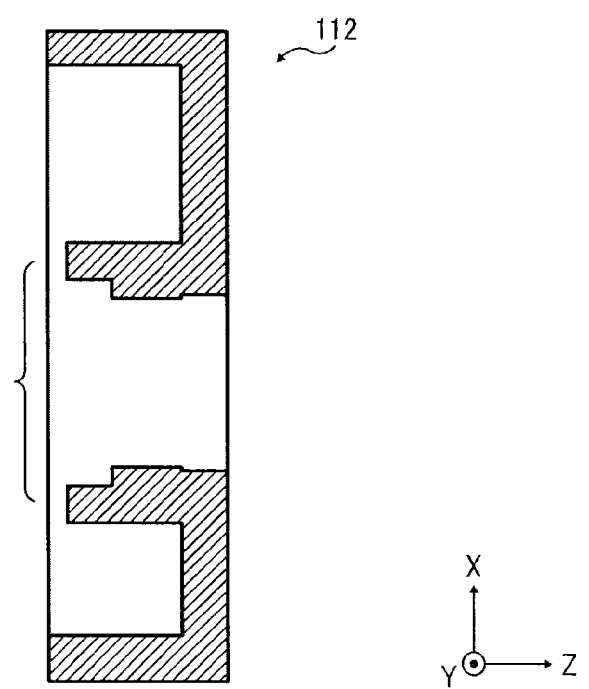
FIG. 4 is a cross-sectional view of a light source support about X-Z direction.
Figure 5:
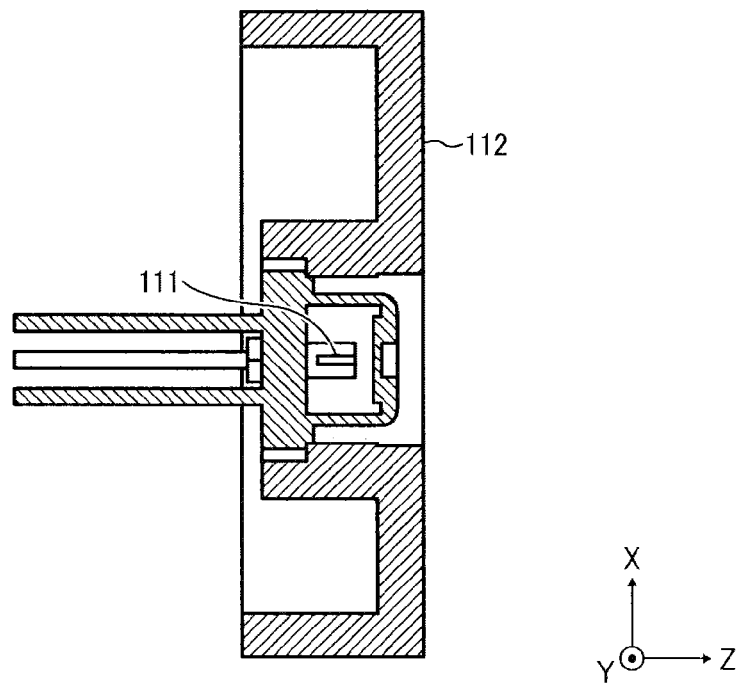
FIG. 5 is a diagram illustrating a state in which a semiconductor laser is held by the light source support.

The light source support 112 holds the semiconductor laser 111. The light source support 112 has a stepped hole from where the semiconductor laser 111 is press-fitted as illustrated in FIGS. 4 and 5. The semiconductor laser 111 is positioned about the Z axis by being press-fitted in the stepped hole.

Figure 6:
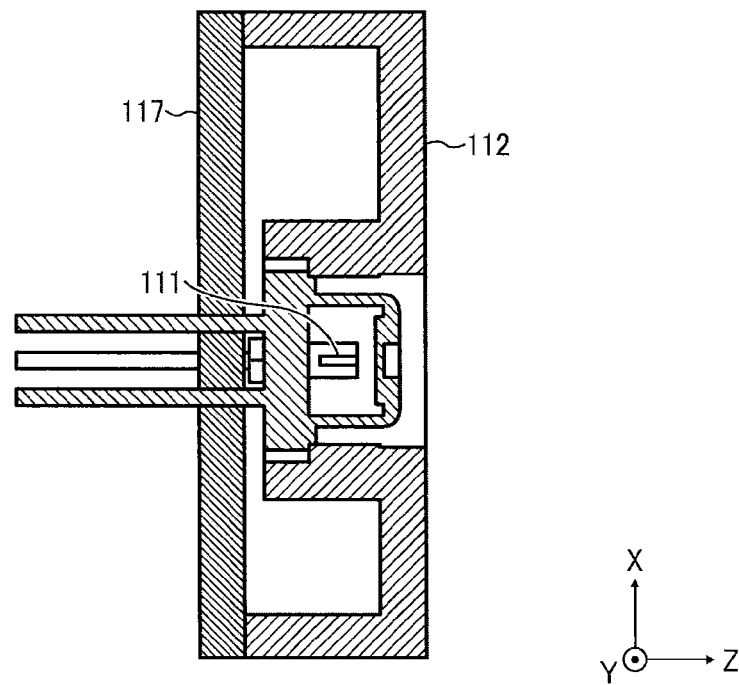
FIG. 6 is a diagram illustrating a state in which a printed substrate is attached to the light source support.

The printed substrate 117 is, for example, fixed on the light source support 112 as illustrated in FIG. 6. The printed substrate 117 can be fixed by a screw, an adhesive, or welding.

In addition, the printed substrate 117 has the same number of holes as the number of lead wires in the semiconductor laser 111. Each lead wire is inserted into a corresponding hole on the printed substrate 117 and soldered to an electroconductive pattern portion thereon.

Figure 7:
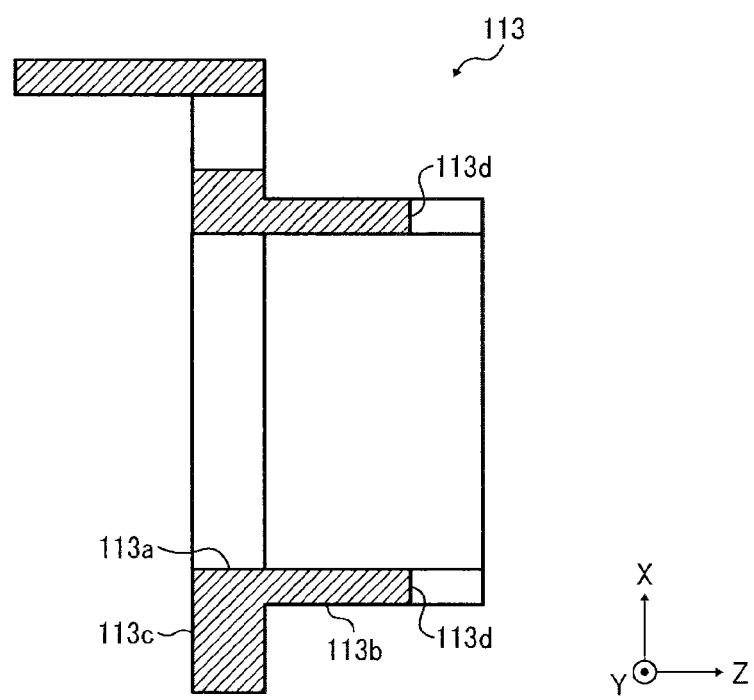
FIG. 7 is a cross-sectional view of a fixing member about X-Z direction.

The fixing member 113 has, for example, a cylinder portion 113b having a through-hole 113a where the lens holder 115 is inserted and a flange portion 113c screwed to the light source support 112 as illustrated in FIG. 7. As illustrated in FIG. 2, the flange portion 113c has three screwed portions. In addition, around the end on the +Z of the cylinder portion 113b, multiple injection portion (e.g., cutout portions) 113d are formed. In FIG. 2, 8 cutout portions 113d are arranged rotation symmetry about the optical axis of the collimating lens 114.

In addition, in the present embodiment, the fixing member 113 is made of a resin transparent to ultraviolet light. The material of the fixing member 113 is not limited to the resin transparent to ultraviolet light.

Figure 8:
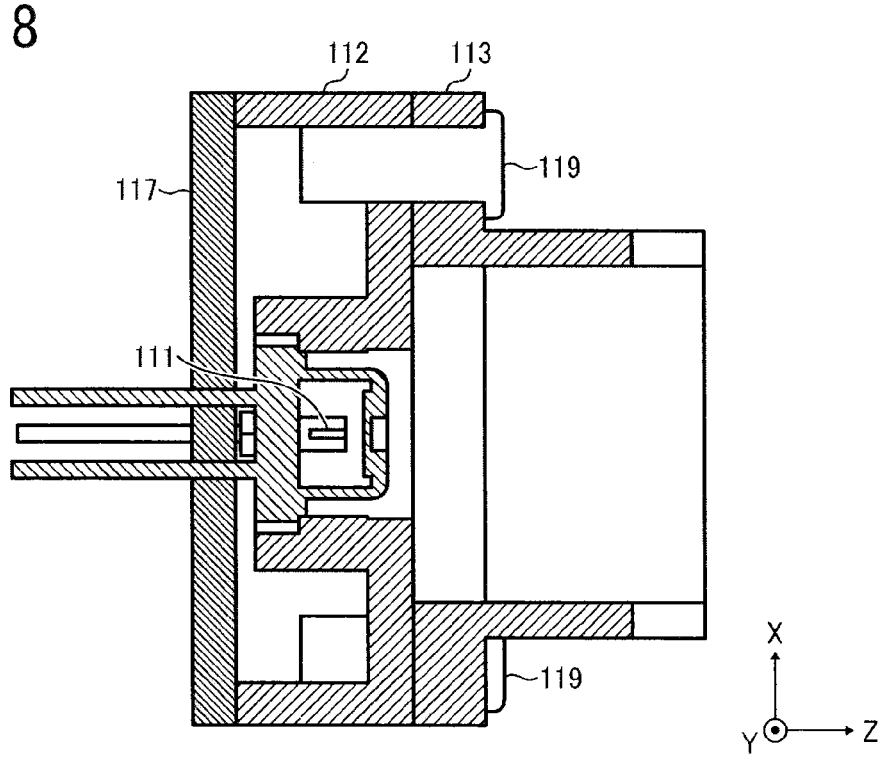
FIG. 8 is a diagram illustrating a state in which the fixing member is attached to the light source support.

FIG. 8 is a diagram illustrating a state in which the fixing member 113 is fastened to the light source support 112 by a screw 119. In FIG. 8, the fixing member 113 is temporarily fastened to the light source support 112.

The collimating lens 114 collimates the light emitted from the semiconductor laser 111.

Figure 9:
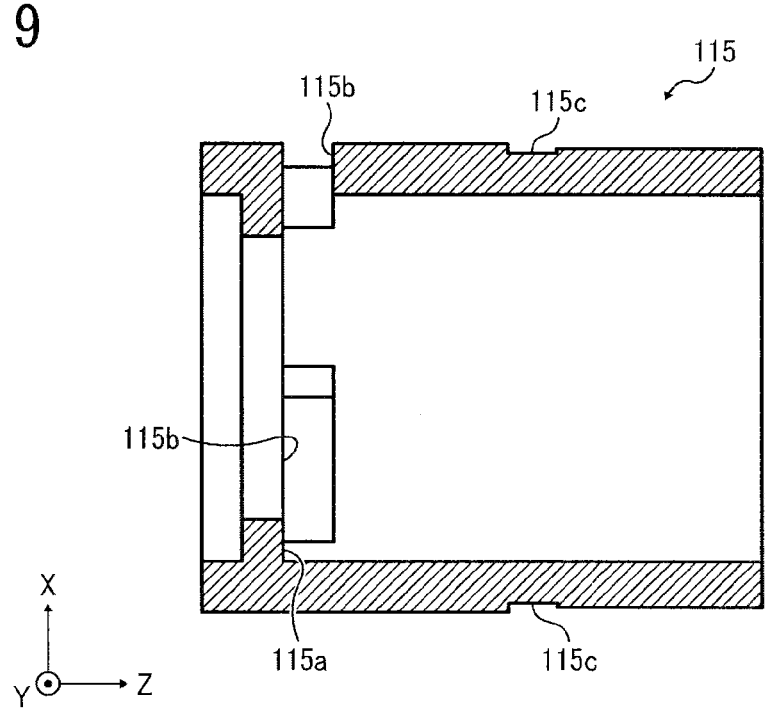
FIG. 9 is a cross-sectional view of the lens holder about X-Z direction.

The lens holder 115 holds the collimating lens 114. The lens holder 115 is cylindrical and has, for example, a strike surface 115a of the collimating lens 114 inside as illustrated in FIG. 9.

Around the strike surface 115a, an open hole 115b is provided from where the adhesive is injected to fasten the collimating lens 114. In FIG. 9, there are three of the open holes 115b.

Around the perimeter of the lens holder 115, a ring-like groove 115c is formed which is concentric to the optical axis of the collimating lens 114.

Figure 10:
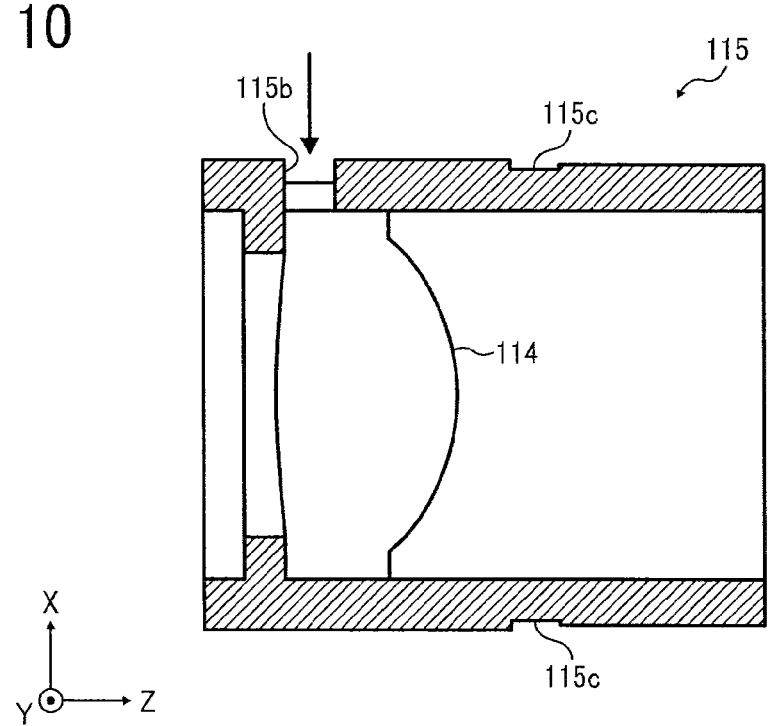
FIG. 10 is a diagram illustrating a state in which the collimating lens is held by the lens holder.

The collimating lens 114 is held at the strike surface 115a of the lens holder 115, for example, as illustrated in FIG. 10, and fastened to the lens holder 115 by the adhesive injected from the open hole 115b. The collimate lens 114 can also be fastened to the lens holder 115 by a method other than the adhesive.

In addition, the strike surface 115a of the lens holder 115 is formed with the surface on −Z side of the collimating lens 114 struck in this drawing. Also, it is possible to form the strike surface 115a with the surface on +Z side of the collimating lens 114 struck.

Figure 11:
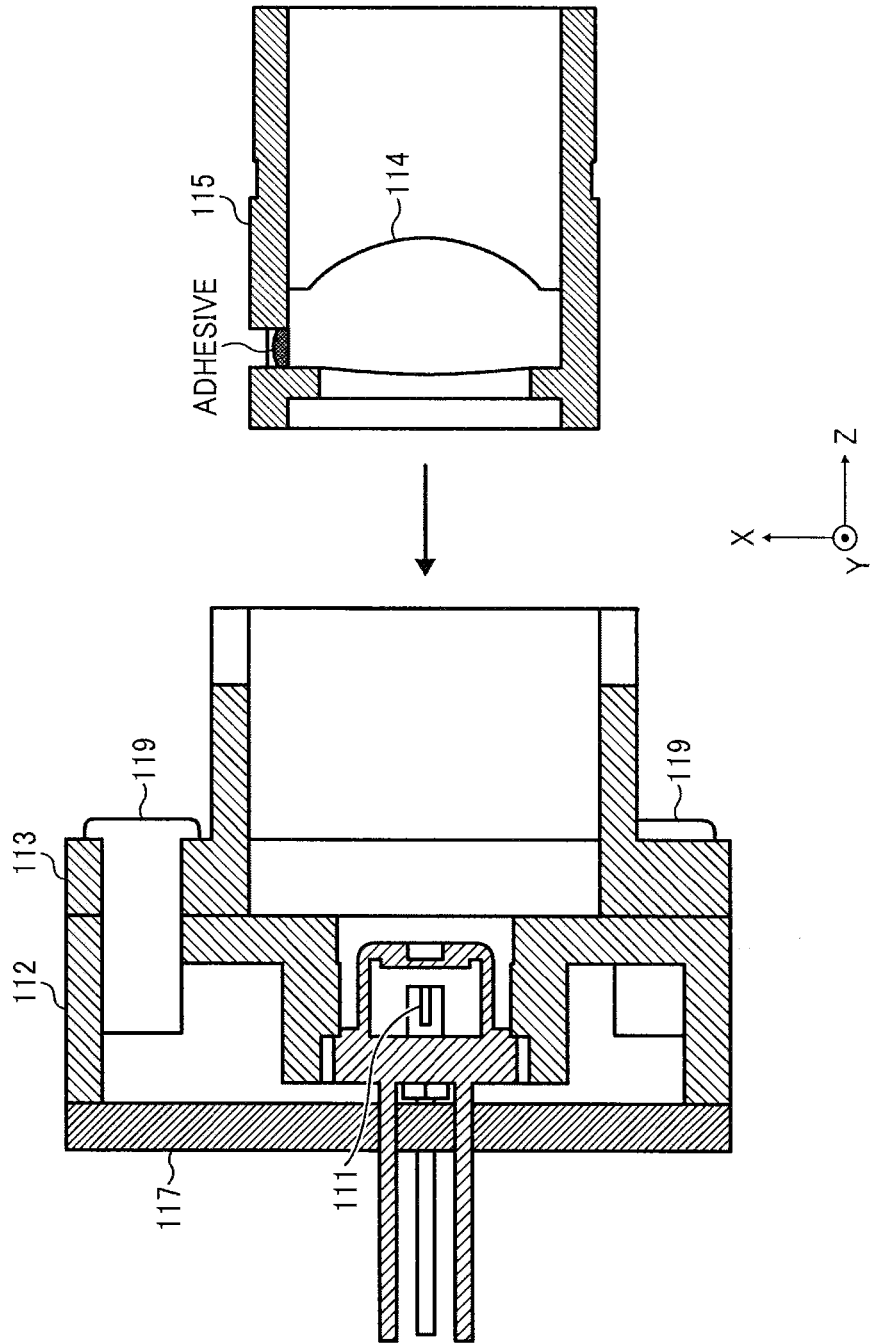
FIG. 11 is a diagram illustrating insertion of the lens holder into a through-hole of the fixing member.
Figure 12:
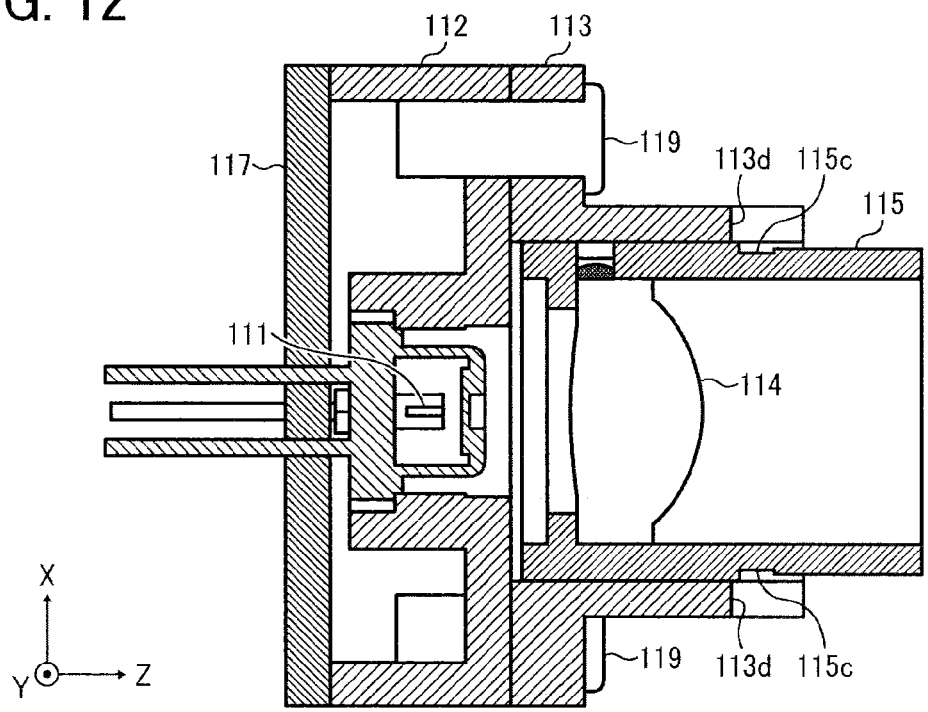
FIG. 12 is a diagram illustrating a state in which the lens holder is inserted into a through-hole of the fixing member.

The lens holder 115 to which the collimating lens 114 is fastened is inserted into the through-hole of the fixing member 113 as illustrated in FIG. 11. The cutout portion 113d of the fixing member 113 is formed in such a manner as to expose the groove 115c of the lens holder 115 to the outside when the lens holder 115 is inserted as illustrated in FIG. 12.

The clearance between the through-hole of the fixing member 113 and the outer perimeter of the lens holder 115 is designed to be from 0.01 mm to 0.03 mm. This reduces the displacement of the collimating lens 14 in the XY plane.

The lens holder 115 is chucked by a jig. The position of the fixing member 113 is fine-adjusted via the lens holder 115 in the X direction and the Y direction to position the luminous point of the semiconductor laser 111 on the optical axis of the collimating lens 114 and finally fastened with the screw 119.

Thereafter, to match the focus position of the collimating lens 114 and the luminous point of the semiconductor laser 111, the position of the lens holder 115 is adjusted in the Z axis direction.

Figure 13:
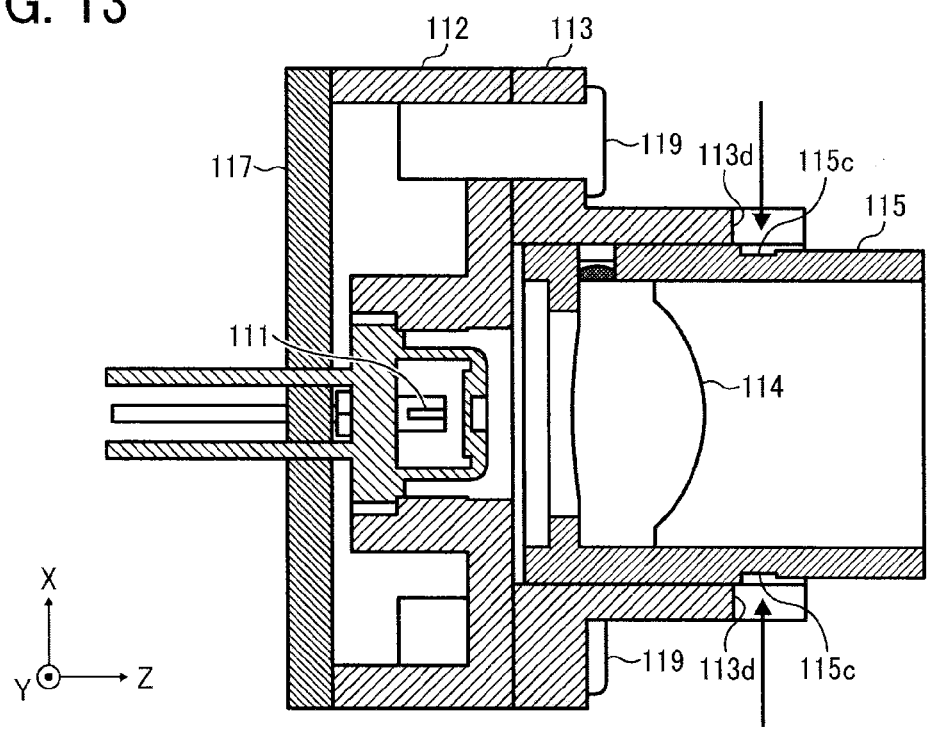
FIG. 13 is a diagram illustrating injection of an adhesive into the groove of the lens holder.

Thereafter, via the cutout portion 113d of the fixing member 113, an ultraviolet curing adhesive is injected into the groove 115c of the lens holder 115 as illustrated in FIG. 13. In this case, the cutout portion 113d forms the injection portion of the adhesive and the injection portion is adjacent to the groove 115c of the lens holder 115 about a direction perpendicular to the optical axis of the collimating lens. The adhesive is not limited to the ultraviolet curing adhesive. For example, a heat curing adhesive is also usable.

Figure 14:
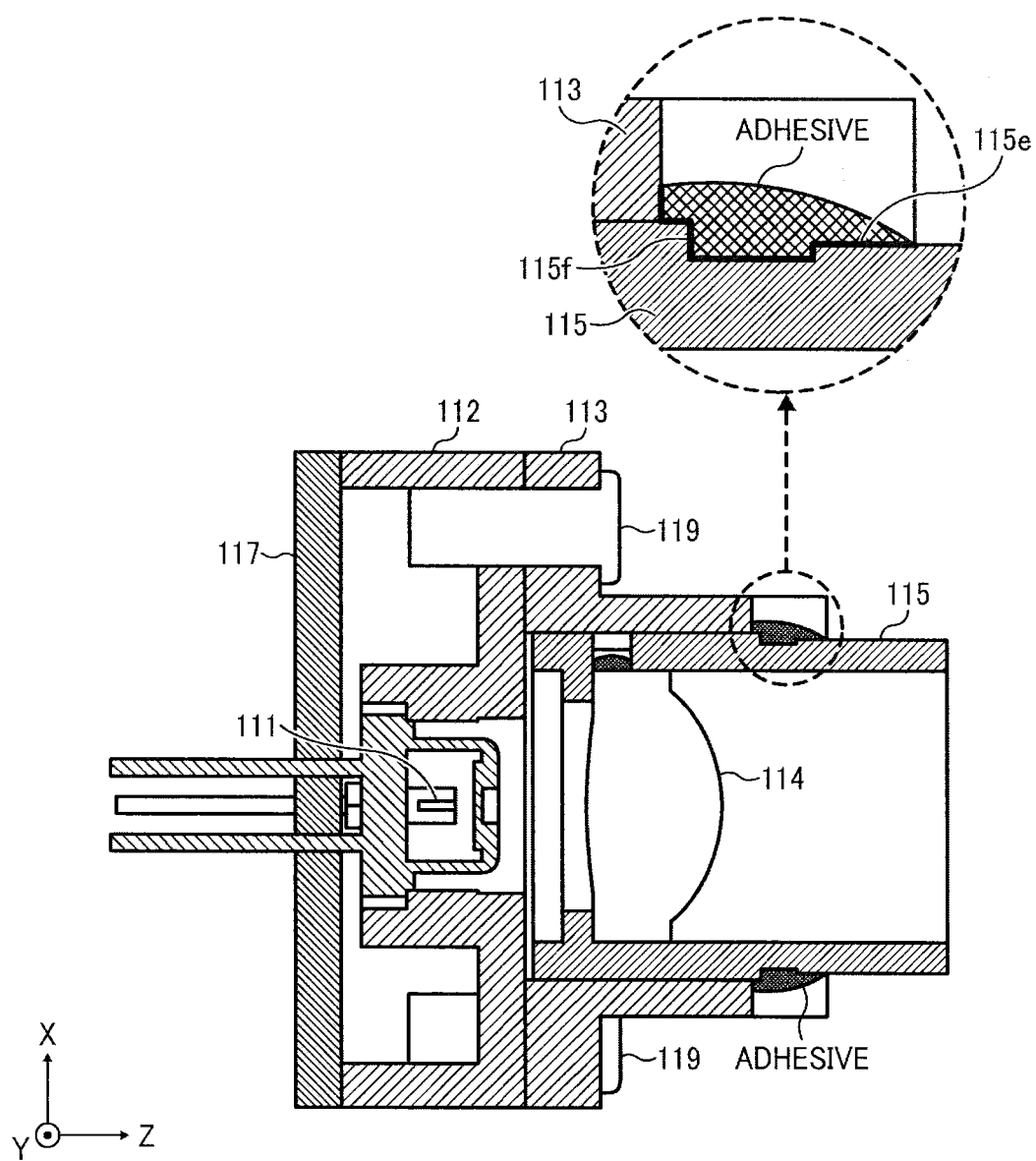
FIG. 14 is a diagram illustrating a state in which the adhesive injected into the groove of the lens holder is cured.

The adhesive injected into the groove 115c of the lens holder 115 via the cutout portion 113d of the fixing member 113 penetrates into the entire groove conforming to the form of the groove 115c. Thereafter, the adhesive is cured by irradiation with ultraviolet light. FIG. 14 is a diagram illustrating a state in which the adhesive is cured. The lens holder 115 is fastened to the fixing member 113 by the adhesive.

The adhesive shrinks during curing. With regard to the Z axis, since the clearance between the through-hole of the fixing member 113 and the outer perimeter of the lens holder 115 is small, the positional variance of the lens holder 115 about the direction perpendicular to the Z axis is extremely small. In addition, with regard to the Z axis direction, since the fixing member 113 and the lens holder 115 are chucked by a jig, the positional variance of the lens holder 115 about the Z axis is extremely small.

The adhesive force of the adhesive is weak to an impact along the direction parallel to the attachment surface of the adhesive.

In this embodiment, as illustrated in FIG. 14, since an attachment surface 115e along the Z axis and an attachment surface 115f in the direction perpendicular to the Z axis direction are present as the attachment surfaces of the adhesive on the lens holder 115, the attachment surface 115f in the direction perpendicular to the Z axis direction has a high durability for an impact along the Z axis, thereby securing a high adhesive force against the impact from the Z-axis direction In addition, in this embodiment, since the adhesive is applied to the outer perimeter of the lens holder 115 in a ring-like form, the attachment area with the fixing member 113 increases, resulting in a strong adhesive force.

In this embodiment, against an impact from the direction perpendicular to the Z axis, the durability is improved by reducing the clearance between the through-hole of the fixing member 113 and the outer perimeter of the lens holder 115. Against an impact along the Z axis direction, the durability is improved by forming the groove 115c on the lens holder 115 to provide the attachment surface of the adhesive perpendicular to the Z axis. As described above, the robustness of the light source unit 100 about the peeling-off of the adhesive against an impact is improved so that the light source unit 100 is capable of emitting beams of light having a stable optical axiality and collimation.

Figure 15:
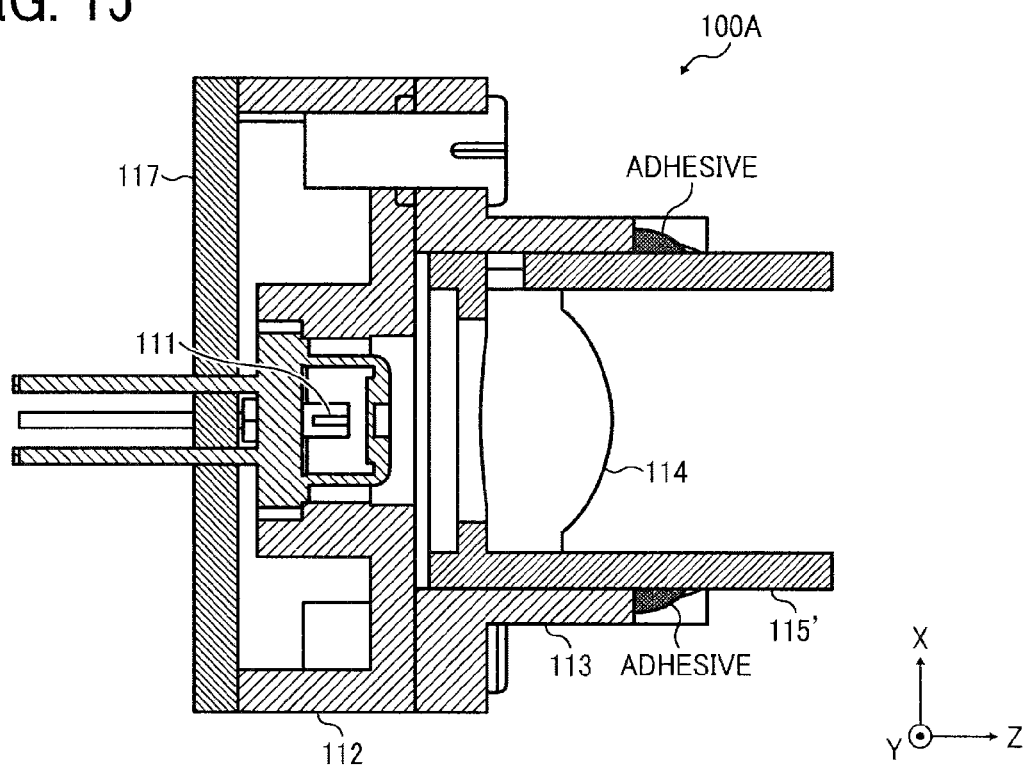
FIG. 15 is a diagram illustrating a comparative example of the lens holder.

As a comparative example, a light source unit 100A using a lens holder 115 having no groove 115c instead of the lens holder 115 is illustrated in FIG. 15.

In the light source unit 100A, there is provided only the attachment surface of the adhesive to fix the lens holder 115 on the fixing member 113, which is along the Z axis. If an impact along the Z axis is applied, the adhesive easily peels off.

As described above, the light source unit 100 of this embodiment includes the semiconductor laser 111, the light source support 112 to hold the semiconductor laser 111, the fixing member 113, the collimating lens 114, the lens holder 115 to hold the collimating lens 114, and optionally the printed substrate 117.

The fixing member 113 is attached to the light source support 112 and has the through-hole 113a through which the beams of light emitted from the semiconductor laser 111 pass. The lens holder 115 is cylindrical and is inserted into the through-hole 113a of the fixing member 113. The clearance between the through-hole of the fixing member 113 and the outer perimeter of the lens holder 115 is designed to be from 0.01 mm to 0.03 mm.

Moreover, the lens holder 115 has the groove 115c provided on the outer perimeter and the groove 115c has a ring-like form concentric to the optical axis of the collimating lens.

Multiple cutout portions 113d are formed on the fixing member 113 to inject the adhesive into the groove 115c of the lens holder 115. The adhesive fastens the lens holder 115 onto the fixing member 113. This adhesive has an attachment surface parallel to the Z axis and an attachment surface perpendicular to the Z axis for the lens holder 115.

In this case, the durability is improved against an impact from the direction perpendicular to the Z axis because the clearance between the through-hole of the fixing member 113 and the outer perimeter of the lens holder 115 is small. The durability is improved against an impact along the Z axis because the groove 115c is formed on the lens holder 115 and the attachment surface of the adhesive is provided perpendicular to the Z axis. As a consequence, the robustness of the light source unit 100 about the peeling-off of the adhesive against an impact is improved so that the light source unit 100 is capable of emitting beams of light having stable optical axiality and collimation.

In addition, since the fixing member 113 is formed of a resin transparent to ultraviolet light, the adhesive present between the fixing member 113 and the lens holder 115 can be cured. Accordingly, the attachment area can be enlarged.

In the embodiment described above, the number of the cutout portions 113d in the fixing member 113 is 8 but is not limited thereto in the present disclosure. However, it is preferable to arrange the multiple cutout portions 113d rotation symmetry about the optical axis of the collimating lens 114.

In addition, in the embodiment described above, the adhesive is applied around the outer perimeter of the lens holder 115 in a ring-like manner but can be applied, for example, at multiple positions on the outer perimeter of the lens holder 115.

Figure 16:
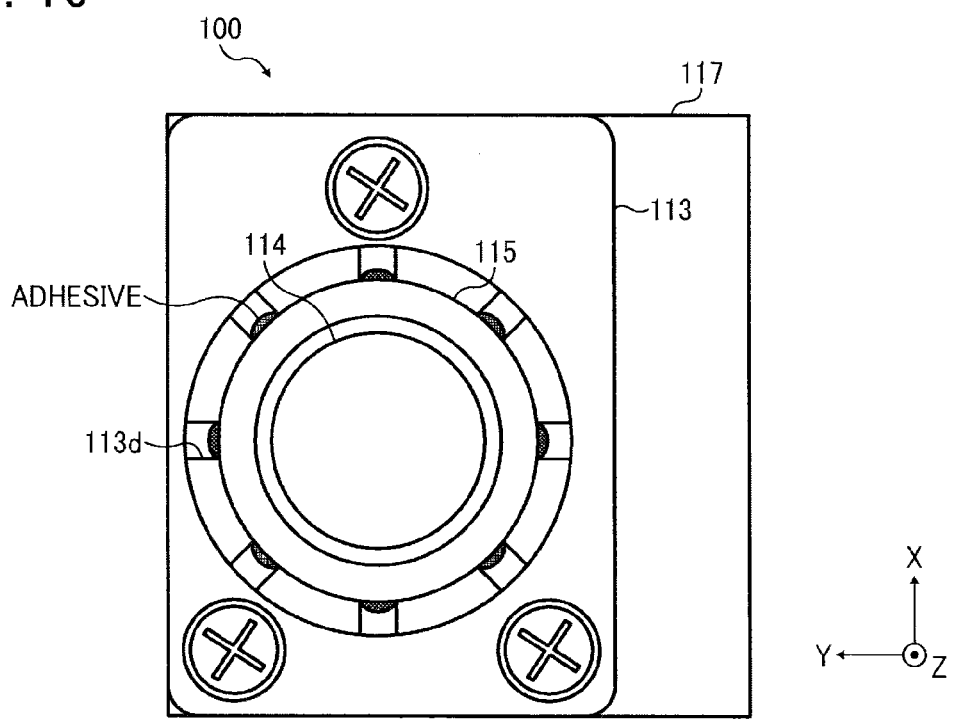
FIG. 16 is a diagram illustrating another example of injection of an adhesive to the groove of the lens holder.

In this case, it is also preferable to arrange the multiple positions of the adhesive rotation symmetry about the optical axis of the collimating lens 114 as illustrated in FIG. 16. This makes it possible to reduce displacement of the position of the lens holder 115 about the direction perpendicular to the Z axis due to the cure shrinkage of the adhesive.

When the lens holder 115 is manufactured by mold injection of a resin, it is preferable that the position of the groove 115c matches the position of the gate through which the resin is injected and the position of the ejector pin inserted when drawing out a molded product. As a result, the dimension accuracy of the outer perimeter of the lens holder 115 is high, thereby making it possible to reduce the clearance between the through-hole of the fixing member 113 and the outer perimeter of the lens holder 115.

Furthermore, since the mark of the gate or of the ejector pin remain in the groove 115c, slight concavo-convex portions are formed thereon, resulting in an increase of the actual attachment surface.

In addition, in the embodiment described above, when a resin mold product is used as the collimating lens 114 and the lens holder 115, the collimating lens 114 and the lens holder 115 can be manufactured by monolithic molding. This results in a smaller bill of material.

Figure 17:
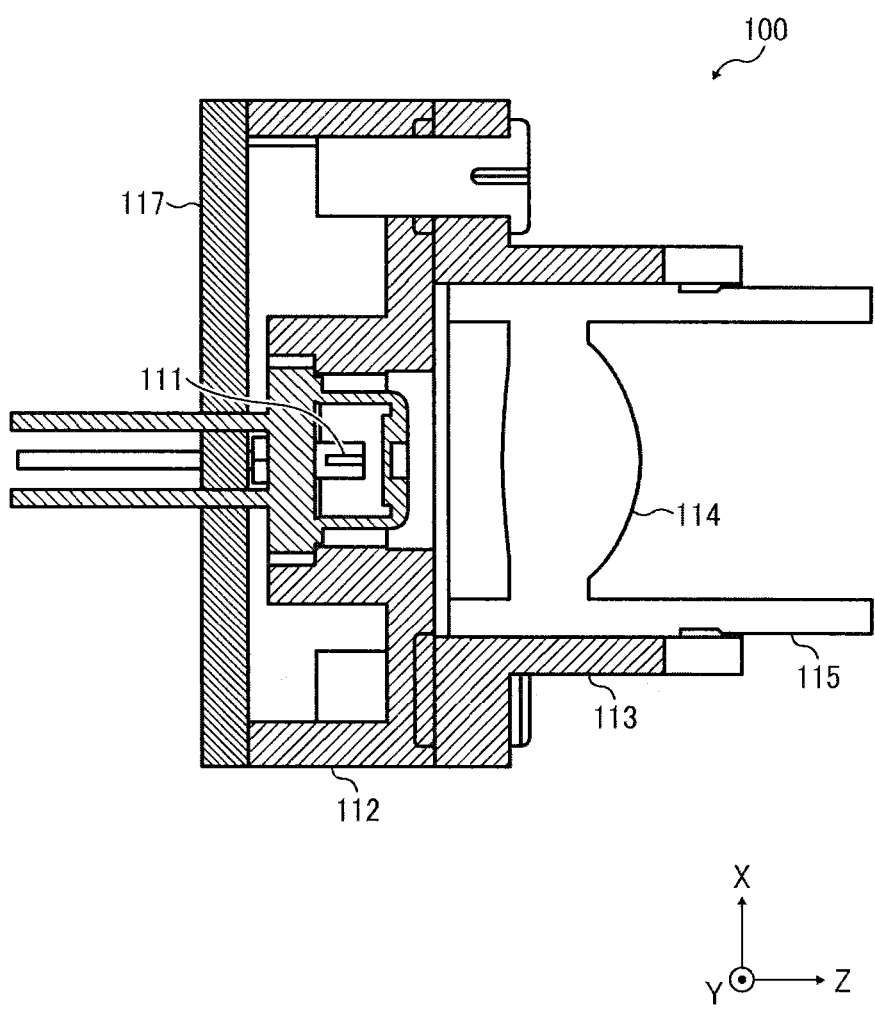
FIG. 17 is a diagram illustrating an example of monolithic molding of the collimating lens and the lens holder.

Moreover, this obviates the fixing of the collimating lens 114 onto the lens holder 115. FIG. 17 is a view illustrating the light source unit 100 using the collimating lens 114 and the lens holder 115 manufactured by monolithic molding.

In addition, in the embodiment described above, an opening portion to inject an adhesive into the groove 115 of the lens holder 115 can be provided in place of the cutout portion 113d of the fixing member 113.

Figure 18A:
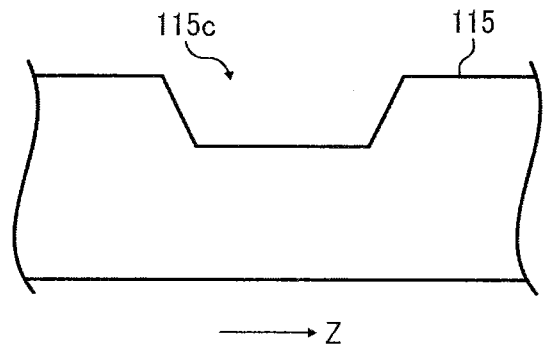
FIG. 18A and FIG. 18B are diagrams illustrating variations of the groove of the lens holder.
Figure 18B:
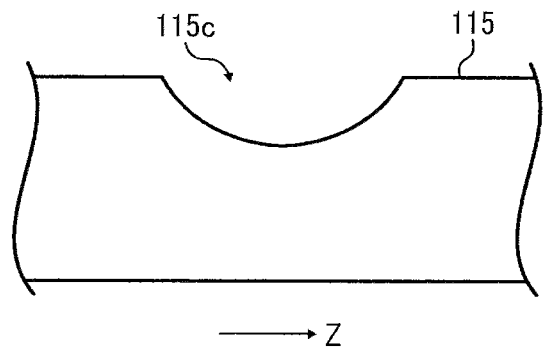

In the embodiment described above, the wall face of the groove 115c in the lens holder 115 is orthogonal to the Z axis but can be placed tilted or curved about the Z axis as illustrated in FIGS. 18A and 18B. This tilted attachment surface about the Z axis improves the durability against an impact from the Z-axis direction more than in a conventional case.

Figure 19:
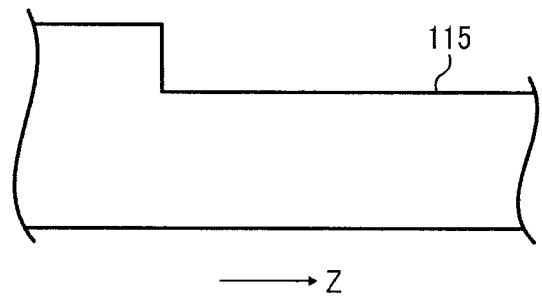
FIG. 19 is a diagram illustrating a variation of the lens holder.

Moreover, in the embodiment described above, instead of forming the groove 115c on the lens holder 115, for example, it is suitable to make the outer diameter of the portion on the +Z side smaller than that of the portion where an adhesive is applied as shown in FIG. 19. In this case, the portion having a changed outer diameter forms a tilted attachment surface about the Z axis.

The light source unit 100 described above is particularly suitable as a light source for a device used outdoors, for example, a laser radar installed in a vehicle to detect the road status, etc.

The light source unit of the present disclosure prevents the displacement of the relative positions of the luminous point of the semiconductor laser and the collimating lens even if an impact is applied to the light source from the direction parallel to the optical axis of the collimating lens.

Having now fully described embodiments of the present invention, it will be apparent to one of ordinary skill in the art that many changes and modifications can be made thereto without departing from the spirit and scope of embodiments of the invention as set forth herein.

What is claimed is:

1. A light source unit comprising:
   a light source;
   a light source support to hold the light source;
   a fixing member attached to the light source support, having a through-hole through which beams of light emitted from the light source pass;
   a lens holder inserted into the through-hole and attached to the fixing member by an adhesive; and
   a collimating lens to collimate the beams of light from the light source,
   wherein attachment surfaces of the adhesive for the lens holder comprise a tilted attachment surface tilted relative to an optical axis of the collimating lens,
   wherein the fixing member comprises multiple injection portions to inject the adhesive to the tilted attachment surface,
   wherein the multiple injection portions are formed rotationally symmetric about the optical axis of the collimating lens when viewed from the optical axis,
   wherein the multiple injection portions are adjacent to the tilted attachment surface about a direction perpendicular to the optical axis direction of the collimating lens, and
   wherein an emitting surface of the collimating lens is located between an adhesive portion of the fixing member and the lens holder and the light source.

2. The light source unit according to claim 1, wherein the lens holder comprises a groove having a surface constituting the tilted attachment surface.

3. The light source unit according to claim 2, wherein the lens holder is a molded resin product and the groove has a mark of a gate formed during molding.

4. The light source unit according to claim 2, wherein the lens holder is a molded resin product and the groove has a mark of an ejector pin formed during molding.

5. The light source unit according to claim 1, wherein the multiple injection portions are cutout portions.

6. The light source unit according to claim 1, wherein the tilted attachment surface about the optical axis of the collimating lens is perpendicular to the optical axis.

7. The light source unit according to claim 1, wherein the fixing member is formed of a resin transparent to ultraviolet light.

8. The light source unit according to claim 1, wherein the collimating lens and the lens holder are formed by monolithic molding.

9. The light source unit according to claim 1, wherein the collimating lens is fixed to the lens holder by an adhesive.

10. The light source unit according to claim 1, further comprising a printed substrate comprising at least part of a drive circuit to drive the light source, the printed substrate being attached to the light source support.

11. The light source unit according to claim 1, wherein a clearance between the through hole of the fixing member and an outer perimeter of the lens holder is from 0.01 mm to 0.03 mm.

* * * * *